United States Patent
Kouchi et al.

(10) Patent No.: US 10,438,929 B2
(45) Date of Patent: Oct. 8, 2019

(54) SEMICONDUCTOR DEVICE

(71) Applicant: TOSHIBA MEMORY CORPORATION, Minato-ku (JP)

(72) Inventors: Toshiyuki Kouchi, Kawasaki (JP); Masaru Koyanagi, Ota (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/508,035

(22) PCT Filed: Sep. 17, 2014

(86) PCT No.: PCT/JP2014/074460
§ 371 (c)(1),
(2) Date: Mar. 1, 2017

(87) PCT Pub. No.: WO2016/042603
PCT Pub. Date: Mar. 24, 2016

(65) Prior Publication Data
US 2017/0309598 A1    Oct. 26, 2017

(51) Int. Cl.
*H01L 25/065* (2006.01)
*G11C 5/00* (2006.01)
(Continued)

(52) U.S. Cl.
CPC ............ *H01L 25/0657* (2013.01); *G11C 5/00* (2013.01); *G11C 5/025* (2013.01); *G11C 5/063* (2013.01);
(Continued)

(58) Field of Classification Search
CPC ....... H01L 24/81; H01L 24/06; H01L 25/043; H01L 25/0657; H01L 25/074;
(Continued)

(56) References Cited

U.S. PATENT DOCUMENTS 5,585,675 A * 12/1996 Knopf .................. H01L 23/481
257/686
6,448,661 B1 * 9/2002 Kim ...................... H01L 23/481
257/686
(Continued)

FOREIGN PATENT DOCUMENTS

CN    102820283 A    12/2012
CN    102890959 A    1/2013
(Continued)

OTHER PUBLICATIONS

International Search Report dated Dec. 2, 2014 in PCT/JP2014/074460 filed Sep. 17, 2014.

*Primary Examiner* — David A Zarneke
(74) *Attorney, Agent, or Firm* — Oblon, McClelland, Maier & Neustadt, L.L.P.

(57) ABSTRACT

According to one embodiment, M (M represents an integer of 2 or larger) semiconductor chips and through electrodes for N (N represents an integer of 2 or larger) channels are provided. The M semiconductor chips are stacked in sequence. The through electrodes are embedded in the semiconductor chips to connect electrically the semiconductor chips in the direction of stacking. The connection destination of the through electrodes are exchanged between one or more upper and lower layers of the semiconductor chips.

17 Claims, 10 Drawing Sheets

(51) Int. Cl.
*G11C 16/04* (2006.01)
*G11C 16/06* (2006.01)
*H01L 23/00* (2006.01)
*G11C 5/02* (2006.01)
*G11C 5/06* (2006.01)

(52) U.S. Cl.
CPC .......... *G11C 16/0483* (2013.01); *G11C 16/06* (2013.01); *H01L 24/16* (2013.01); *H01L 24/32* (2013.01); *H01L 24/73* (2013.01); *H01L 2224/16145* (2013.01); *H01L 2224/32145* (2013.01); *H01L 2224/73203* (2013.01); *H01L 2225/06506* (2013.01); *H01L 2225/06541* (2013.01); *H01L 2924/1438* (2013.01)

(58) Field of Classification Search
CPC .............. H01L 25/0756; H01L 25/117; H01L 2225/06541; H01L 2225/06544; H01L 23/481; H01L 21/486
See application file for complete search history.

(56) References Cited

U.S. PATENT DOCUMENTS

| | | | |
|---|---|---|---|
| 8,259,619 B2 * | 9/2012 | Hasegawa | H04L 12/44 370/255 |
| 8,310,382 B2 | 11/2012 | Ide et al. | |
| 8,334,599 B2 | 12/2012 | Bruennert et al. | |
| 8,400,781 B2 * | 3/2013 | Gillingham | G11C 5/02 216/18 |
| 8,400,805 B2 | 3/2013 | Yoko | |
| 8,624,375 B2 * | 1/2014 | Min | H01L 25/0657 257/685 |
| 8,780,647 B2 * | 7/2014 | Ishikawa | G01R 31/2884 365/189.011 |
| 8,790,647 B2 * | 7/2014 | Greenwood | C07K 14/47 424/141.1 |
| 8,933,345 B1 * | 1/2015 | Rahman | H01L 23/147 174/262 |
| 9,240,381 B2 * | 1/2016 | Lin | H01L 23/5384 |
| 9,305,909 B2 * | 4/2016 | Ko | H01L 25/18 |
| 9,880,959 B2 * | 1/2018 | Best | G06F 13/362 |
| 9,893,037 B1 * | 2/2018 | Lin | H01L 25/0657 |
| 2006/0294335 A1 | 12/2006 | Vogt | |
| 2009/0091333 A1 * | 4/2009 | Chung | H01L 22/22 324/538 |
| 2010/0090338 A1 * | 4/2010 | Lee | H01L 21/76898 257/737 |
| 2010/0193962 A1 * | 8/2010 | Shibata | H01L 23/544 257/773 |
| 2010/0195364 A1 * | 8/2010 | Riho | G11C 5/02 365/63 |
| 2011/0079923 A1 * | 4/2011 | Suh | G11C 5/02 257/777 |
| 2011/0079924 A1 | 4/2011 | Suh | |
| 2011/0089973 A1 * | 4/2011 | Kondo | G11C 5/02 326/82 |
| 2011/0108972 A1 * | 5/2011 | Foster, Sr. | H01L 25/0657 257/686 |
| 2011/0260331 A1 * | 10/2011 | Lee | H01L 23/544 257/774 |
| 2012/0092943 A1 * | 4/2012 | Nishioka | G11C 16/20 365/191 |
| 2012/0262196 A1 | 10/2012 | Yokou | |
| 2012/0262198 A1 | 10/2012 | Riho | |
| 2012/0314511 A1 * | 12/2012 | Ishikawa | G01R 31/2884 365/189.05 |
| 2013/0021866 A1 * | 1/2013 | Lee | H01L 25/0657 365/230.01 |
| 2013/0093099 A1 | 4/2013 | Shin et al. | |
| 2013/0234340 A1 | 9/2013 | Suh | |
| 2013/0272049 A1 * | 10/2013 | Vogt | G11C 5/06 365/63 |
| 2013/0277861 A1 | 10/2013 | Suh | |
| 2013/0280863 A1 | 10/2013 | Suh | |
| 2014/0062587 A1 * | 3/2014 | Koyanagi | G06F 3/0688 327/595 |
| 2014/0078843 A1 | 3/2014 | Nishioka | |
| 2014/0269108 A1 | 9/2014 | Ishikawa | |
| 2014/0369145 A1 | 12/2014 | Nishioka | |
| 2015/0078085 A1 | 3/2015 | Koyanagi | |
| 2016/0351547 A1 | 12/2016 | Koyanagi | |

FOREIGN PATENT DOCUMENTS

| | | |
|---|---|---|
| JP | 2008-547124 A | 12/2008 |
| JP | 2010-182366 A | 8/2010 |
| JP | 2011-81882 A | 4/2011 |
| JP | 2012-83243 A | 4/2012 |
| JP | 2012-155815 A | 8/2012 |
| JP | 2012-226794 A | 11/2012 |
| JP | 2012-255704 A | 12/2012 |
| JP | 2013-507773 A | 3/2013 |
| JP | 2013-105996 A | 5/2013 |
| JP | 2014-53055 A | 3/2014 |
| TW | 201301472 A1 | 1/2013 |
| TW | 201338098 A | 9/2013 |
| WO | 2005/101475 A1 | 10/2005 |

* cited by examiner

FIG.4
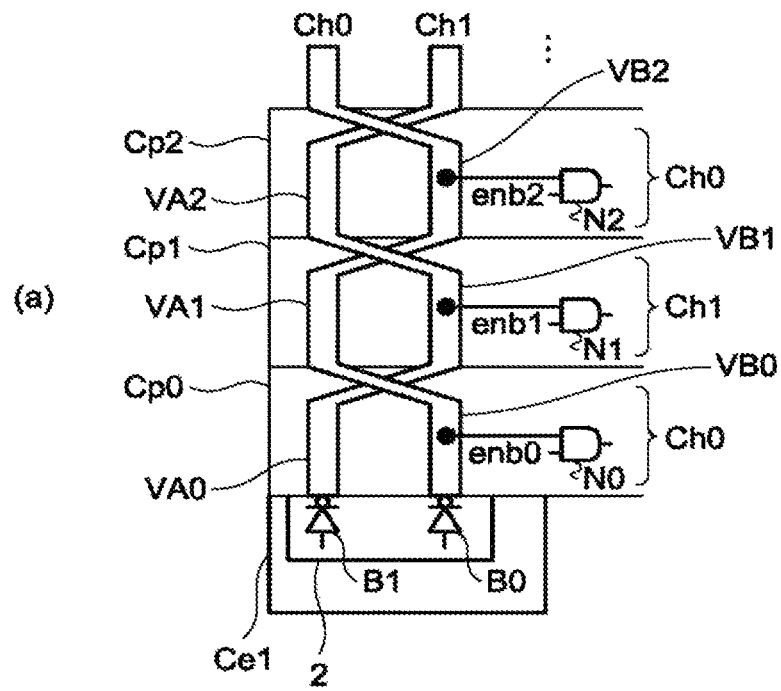
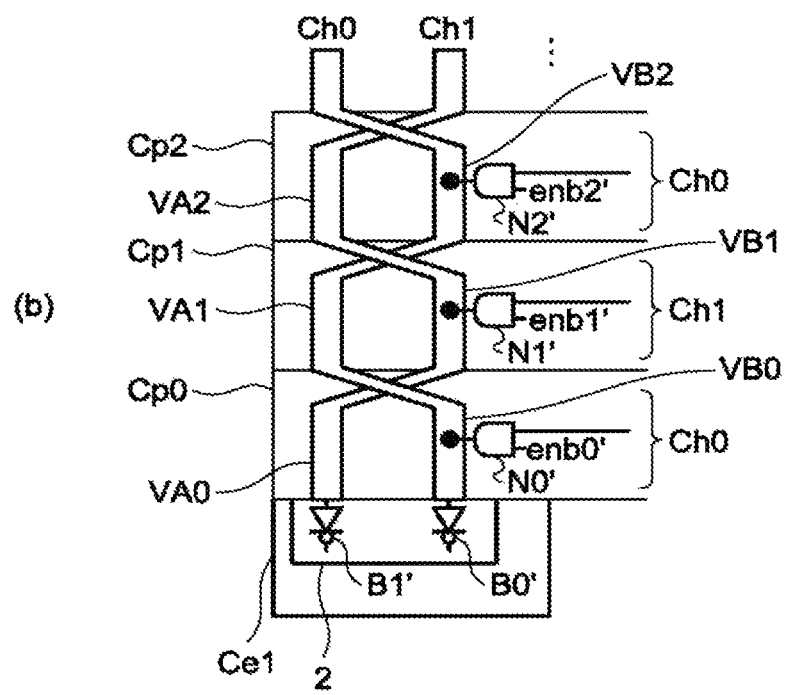

FIG.9

| CH: CHANNEL<br>CE: CHIP ENABLE | SH0 | SH1 | SH2 | SH3 |
|---|---|---|---|---|
| 1CH/1CE | CE0 | | | |
| 1CH/2CE | CE0 | | CE2 | |
| 1CH/4CE | CE0 | CE1 | CE2 | CE3 |
| EACH 2CH/1CE | CE0 | | CE2 | |
| EACH 2CH/2CE | CE0 | CE1 | CE2 | CE3 |
| EACH 4CH/1CE | CE0 | CE1 | CE2 | CE3 |

SEMICONDUCTOR DEVICE

FIELD

The present invention relates to a semiconductor device.

BACKGROUND

Semiconductor chips may be stacked to achieve space saving, higher performance, and a larger capacity of a semiconductor device. The stacked semiconductor chips may be electrically connected by the use of through electrodes called through silicon vias (TSVs).

In such semiconductor devices using the TSVs, logic circuits for channel switching may be provided to the semiconductor chips to achieve multi-channel operations.

CITATION LIST

Patent Literature

Patent Literature 1: JP 2014-53055 A

SUMMARY

Technical Problem

An object of one embodiment according to the present invention is to provide a semiconductor device that implements multi-channel operations while achieving space-saving.

Solution to Problem

According to one embodiment, M (M represents an integer of 2 or larger) semiconductor chips and through electrodes for N (N represents an integer of 2 or larger) channels are provided. The M semiconductor chips are stacked in sequence. The through electrodes are embedded in the semiconductor chips to connect electrically the semiconductor chips in the direction of stacking. The connection destinations of the through electrodes are exchanged between one or more upper and lower layers of the semiconductor chips.

BRIEF DESCRIPTION OF DRAWINGS

FIG. 4(a) is a block diagram of an example of connection method of through electrodes for two channels in the semiconductor chip illustrated in FIG. 2 and FIG. 4(b) is a block diagram of another example of connection method of the through electrodes for the two channels in the semiconductor chip illustrated in FIG. 2.

FIG. 9 is a diagram illustrating an assignment example of chip enable signals to the signals for the four channels illustrated in FIG. 8.

DESCRIPTION OF EMBODIMENTS

A semiconductor device according to embodiments will be explained below in detail with reference to the attached drawings. However, the present invention is not limited by these embodiments.

First Embodiment

Figure 1:
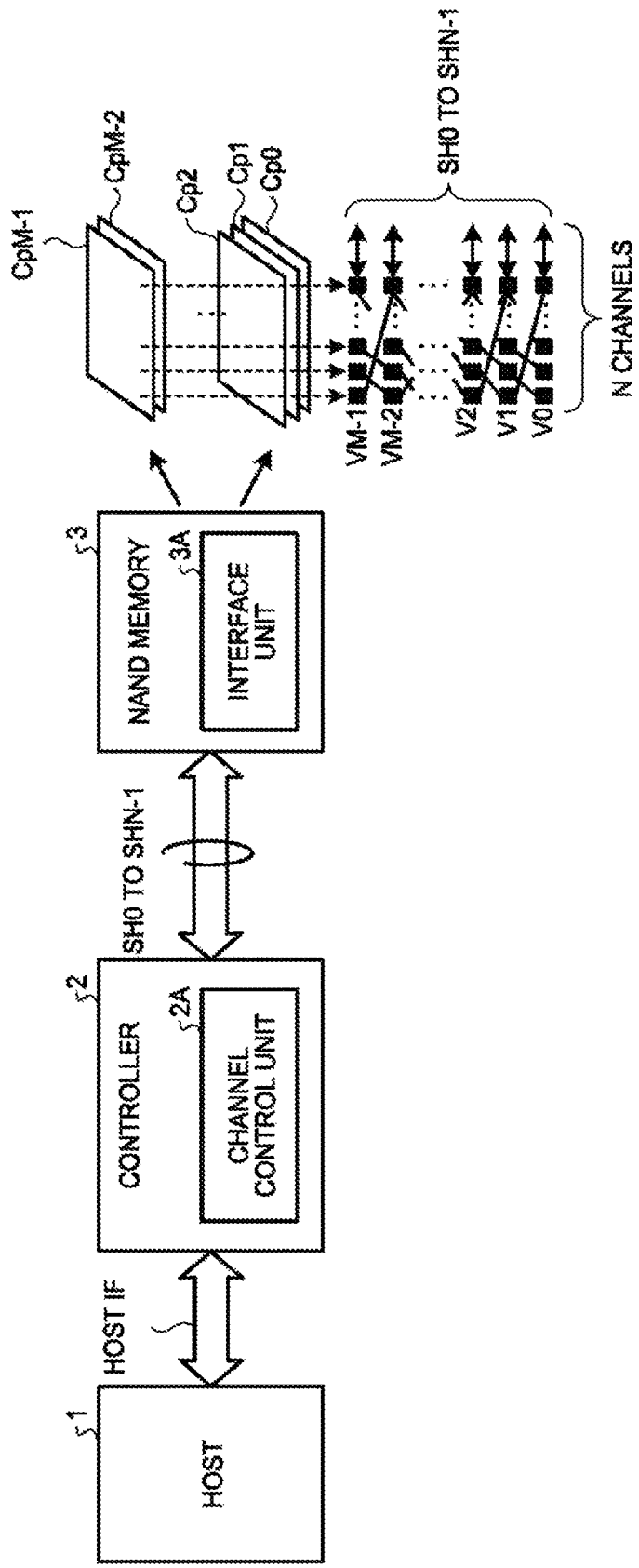
FIG. 1 is a schematic block diagram of a semiconductor device according to a first embodiment.

FIG. 1 is a schematic block diagram of a semiconductor device according to a first embodiment. In the embodiment described below, the semiconductor device is a non-volatile semiconductor device as an example. The non-volatile semiconductor device is an NAND memory as an example.

Referring to FIG. 1, the non-volatile semiconductor device includes an NAND memory 3 a controller 2. The NAND memory 3 is connected to the controller 2. The controller 2 is connected to host 1 via a host IF. The NAND memory 3 can store data 1 to be handled by the host 1. The NAND memory 3 may be mounted in an SSD, an SD card, or a USB memory, for example. The controller 2 can control driving of the NAND memory 3. The control of driving of the NAND memory 3 includes control of reading and writing the NAND memory 3, block selection, error correction, wear levelling, and the like, for example. The host 1 may be a personal computer, an electronic device such as a digital camera, or a mobile terminal such as a smart phone.

The NAND memory 3 includes M (M represents an integer of 2 or larger) semiconductor chips Cp0 to CpM-1 stacked in sequence. The semiconductor chips Cp0 to CpM-1 have through electrodes V0 to VM-1 embedded therein to connect electrically the semiconductor chips Cp0 to CpM-1 in the direction of stacking. In the semiconductor chips Cp0 to CpM-1, the through electrodes V0 to VM-1 can be provided for N (N is an integer of 2 or larger) channels. The through electrodes V0 to VM-1 can be connected such that the destinations of connection are exchanged between one or more upper and lower layers of the semiconductor chips Cp0 to CpM-1. For example, the through electrodes V0 VM-1 can be connected in a tornado form between the upper and lower layers of the semiconductor chips Cp0 to CpM-1.

The NAND memory 3 includes an interface unit 3A that carries signals between the NAND memory 3 and the controller 2. The interface unit 3A can be provided to the individual semiconductor chips Cp0 to CpM-1. The interface unit 3A can handle signals SH0 to SHN-1 for N (N represents an integer of 2 or larger) channels. In this example, the interface unit 3A allows the individual semiconductor chips Cp0 to CpM-1 to internally communicate only a signal for one channel out of the signals SH0 to SHN-1 for the N channels via the through electrodes V0 to VM-1, respectively. At this time, in the semiconductor chips CP0 to CpM-1, the through electrodes V0 to VM-1 with which a signal for one channel is communicated can be fixed to any one of the through electrodes V0 to VM-1 for the N channels. In the semiconductor chips Cp0 to CpM-1, the through electrodes V0 to VM-1 equal in position on a horizontal plane can be selected as the fixed through electrodes V0 to VM-1.

The signals SH0 to SHN-1 for the N channels may be, for example, address latch enable signals ALE, command latch enable signals CLE, read enable signals/RE (/ represents low active signals) and RE, write enable signals/WE, data signals DQ, data strobe signals DQS and/DQS, chip enable signals/CE, write protect signals/WP, ready/busy signals RB, chip addresses CADD, or the like. The controller 2 can control the NAND memory 3 using these signals.

The host 1 is changed by an application to which the NAND memory 3 is applied. When the NAND memory 3 is applied to a solid-state drive (SSD), serial attached SCSI (SAS), serial ATA (SATA), and programmable communications interface (PCIe) are used, when the NAND memory 3 is applied to a universal serial bus (USB) memory or the like, USB is used. When the NAND memory 3 is applied to an embedded multi-media card (eMMC), an interface under eMMC standards is used. When the NAND memory 3 is applied to an SD card, an interface under SD memory standards is used.

The controller 2 includes a channel control unit 2A. The channel control unit 2A controls the number of channels in the NAND memory 3. In this example, the channel control unit 2A can control the number of channels by inputting the same signal to two or more of the through electrodes V0 to VM-1 for the N channels. At this time, when the NAND memory 3 is to operate with K (K represents a positive integer equal to or smaller than M) channels, the channel control unit 2A can divide the N channels into K groups, input the same signal to the same group, and input separate signals to the different groups.

Upon receipt of a request signal output from the host 1 via the host IF, the controller 2 generates chip enable signals /CE, command latch enable signals CLE, address latch enable signals ALE, write enable signals/WE, read enable signals/RE, write protect signals/WP, or the like depending on the request signal.

To write data into the NAND memory 3 in response to the request signal received from the host 1, the controller 2 supplies the data to the NAND memory 3 via one to N channels.

To read data from the NAND memory 3 as a response to the request signal received from the host 1, the controller 2 receives the data from the NAND memory 3 via one to N channels.

In this example, by allowing the individual semiconductor chips Cp0 to CpM-1 to communicate internally only a signal for one channel out of the signals SH0 to SHN-1 for the N channels via the through electrodes V0 to VM-1, respectively, the semiconductor chips Cp0 to CpM-1 do not need to switch the through electrodes V0 to VM-1 according to the specified channel. This eliminates the need to provide logic circuits for channel switching to the semiconductor chips Cp0 to CpM-1, thereby achieving space saving.

In addition, by connecting the through electrodes V0 to VM-1 such that the connection destinations are switched between the upper and lower layers of the semiconductor chips Cp0 to CpM-1, even when the through electrodes V0 to VM-1 in which a signal for one channel is communicated are fixed to the through electrodes V0 to VM-1 equal in position on a horizontal plane in the semiconductor chips Cp0 to CpM-1, the NAND memory 3 can be multi-channeled without changing the layout for the individual semiconductor chips Cp0 to CpM-1.

The through electrodes V0 to VM-1 may be connected such that the connection destinations are switched between some of the upper and lower layers of the semiconductor chips Cp0 to CpM-1, not such that the connection destinations are switched between all of the upper and lower layers of the semiconductor chips Cp0 to CpM-1. For example, when a signal common among the channels is sent, the connection destinations may not be necessarily switched but the through electrodes V0 to VM-1 may be connected in a straight line between the upper and lower layers.

Figure 2:
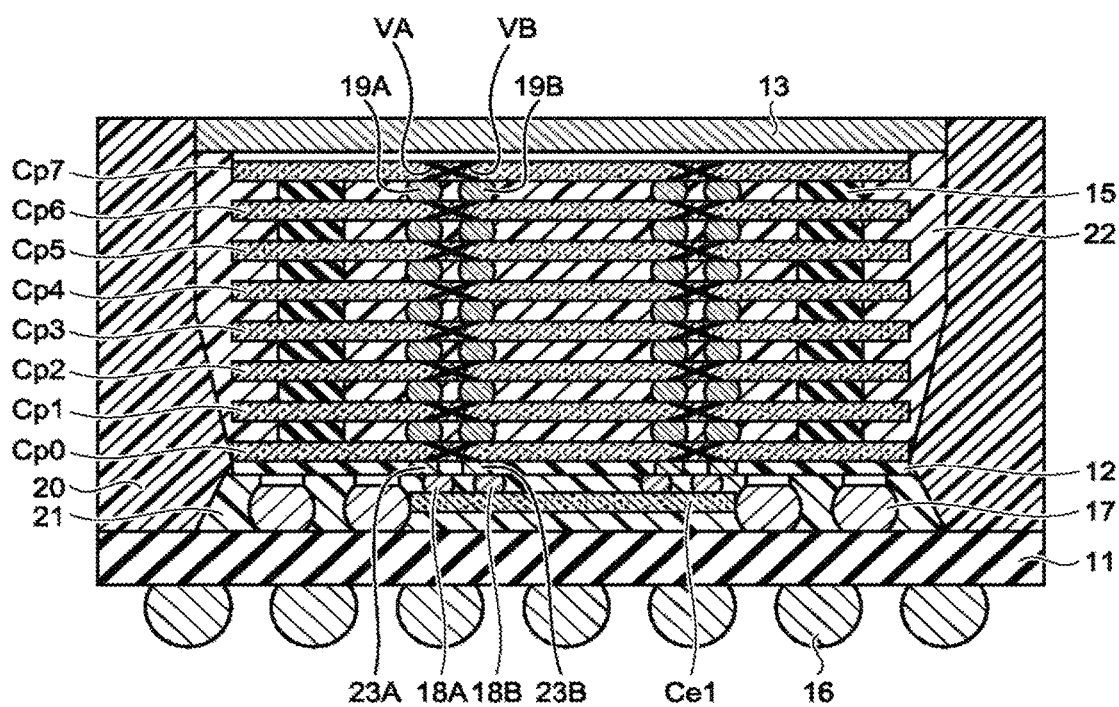
FIG. 2 is a cross-sectional view of a configuration example of a controller and an NAND memory illustrated in FIG. 1.

FIG. 2 is a cross-sectional view of a configuration example of the controller and the NAND memory illustrated in FIG. 1. In the following description, the semiconductor chips Cp0 to CpM-1 correspond to two channels as an example. In addition, FIG. 2 illustrates the case in which M is 8.

Referring to FIG. 2, the semiconductor chips Cp0 to Cp7 are stacked in sequence and mounted on a support substrate 12. The semiconductor chips Cp0 to Cp7 have through electrodes VA to VB for two channels. In the semiconductor chips Cp0 to Cp7, the through electrodes VA are arranged to be equal in position on the horizontal plane, and the through electrodes VB are arranged to be equal in position on the horizontal plane. In addition, in the semiconductor chips Cp0 to Cp7, the through electrodes VA and VB can be arranged adjacent to each other. The through electrodes VA and VB are connected such that the connection destinations are switched between the upper and lower layers of the semiconductor chips Cp0 to Cp7. The through electrodes VA and VB are connected via solder balls 19A and 19B between the semiconductor chips Cp0 to Cp7. The semiconductor chips Cp0 to C7 are connected via adhesion layers 15 between the upper and lower layers.

A controller chip Ce1 is mounted on the back surface of the support substrate 12. The support substrate 12 has wires 23A and 23B. The controller chip Ce1 is connected to the wires 23A and 23B via solder balls 18A and 18B. When the through electrodes VA and VB on the lowest semiconductor chip Cp0 are connected to the wires 23A and 23B, the controller chip Ce1 and the semiconductor chips Cp0 to Cp7 are electrically connected. The support substrate 12 is connected to a mounting substrate 11 via solder balls 17. Solder balls 16 are provided on the back surface of the mounting substrate 11 to connect the mounting substrate 11 to a mother substrate.

The controller chip Ce1 is sealed by a sealing resin 21 on the mounting substrate 11. The semiconductor chips Cp0 to Cp7 are sealed by a sealing resin 22 on the support substrate 12. The outer periphery of the sealing resins 21 and 22 is sealed by a sealing resin 20, and the upper portion of the sealing resin 22 is sealed by a metal plate 13.

Figure 3:
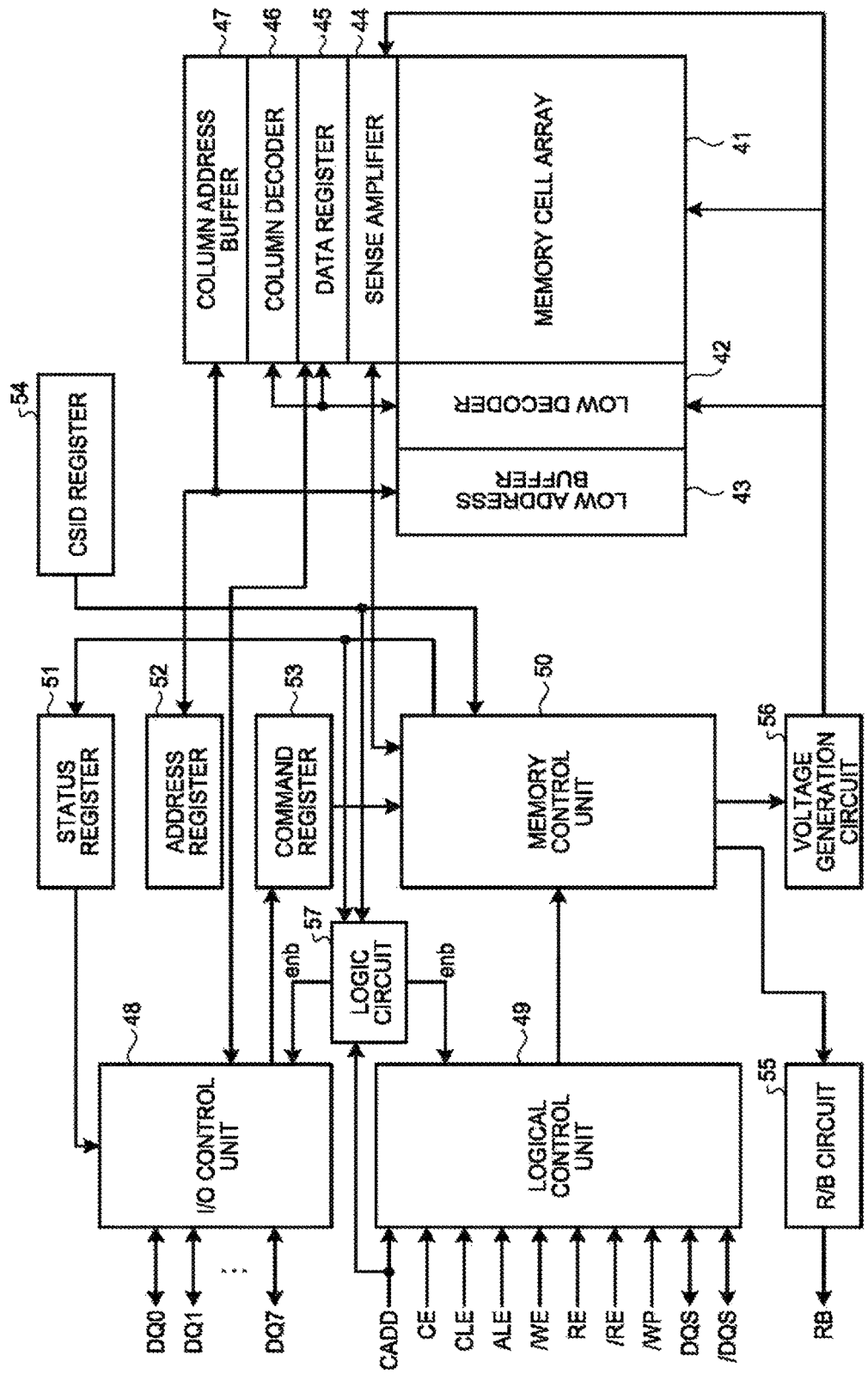
FIG. 3 is a functional block diagram of a semiconductor chip illustrated in FIG. 2.

FIG. 3 is a functional block diagram of a semiconductor chip illustrated in FIG. 2. FIG. 3 describes the semiconductor chip Cp0 as an example, but the same description is also applicable to the semiconductor chips Cp1 to CpM-1.

Referring to FIG. 3, the semiconductor chip Cp0 has a logical control unit 49, a memory control unit 50, a memory cell array 41, a low address buffer 43, a low decoder 42, a sense amplifier 44, a data register 45, a column decoder 46, a column address buffer 47, a voltage generation circuit 56, an input/output (I/O) control unit 48, a command register 53, an address register 52, a status register 51, a CSID register 54, a ready/busy (R/B) circuit 55, and a logic circuit 57.

The controller 2 supplies to the logical control unit 49 a chip enable signal /CE, a command latch enable signal CLE, an address latch enable signal ALE, a write enable signal /WE, read enable signals RE and /RE, a write protect signal /WP, data strobe signals DQS and /DQS, and a chip address CADD. The controller 2 supplies commands, addresses, and data to the I/O control unit 48 via signal lines DQ0 to DQ7.

The logical control unit 49 controls the memory control unit 50 and the I/O control unit 48 according to input signals. The command register 53 holds the commands output from the I/O control unit 48. The address register 52 holds the addresses output from the I/O control unit 48.

The memory control unit 50 controls the low decoder 42, the sense amplifier 44, the data register 45, the column decoder 46, the voltage generation circuit 56, and the R/B circuit 55 according to the commands held in the command register 53 to control writing, reading, and erasing of data, and others.

The R/B circuit 55 outputs a ready/busy signal RB according to the output signal from the memory control unit 50. The voltage generation circuit 56 generates a write voltage, a read voltage, an erase voltage, and the like under instructions from the memory control unit 50, and supplies these voltages to the memory cell array 41, the low decoder 42, and the sense amplifier 44.

The memory cell array 41 has a plurality of NAND strings. The individual NAND strings are formed by connecting in series first and second selection transistors and a plurality of memory cells. The individual memory cells include an electric charge accumulation layer and a control gate electrode. The first selection transistors are connected to bit lines, and the second selection transistors are connected to source lines. Gate electrodes in the first and second selection transistors are connected to first and second selection lines, and the control gate electrodes in the memory cells are connected to word lines. The bit lines are connected to the sense amplifier 44.

The low address buffer 43 and the column address buffer 47 hold low addresses and column addresses held in the address register 52, respectively. The low decoder 42 decodes the low address held in the low address buffer 43, and selects the first and second selection lines and the word line in the memory cell array 41. The column decoder 46 decodes the column address held in the column address buffer 47 and selects the bit line in the memory cell array 41.

At the time of data writing, the data register 45 supplies the data from the I/O control unit 48 to the sense amplifier 44. At the time of data reading, the data register 45 holds the data detected from the selected bit line by the sense amplifier 44 and supplies the same to the I/O control unit 48.

At the time of data writing, the sense amplifier 44 writes the data held in the data register 45 into the selected memory cell. At the time of data reading, the sense amplifier 44 reads the data from the selected memory cell via the bit line.

The status register 51 holds status data output from the memory control unit 50 that indicates whether data writing, data reading, and data erasing have been successfully completed, for example. The status data held in the status register 51 is supplied to the host 1 via the I/O control unit 48 and the controller 2.

The CSID register 54 holds chip identification information for the semiconductor chip Cp0 to identify itself. The chip identification information held in the CSID register 54 is supplied to the memory control unit 50 and the logic circuit 57.

The logic circuit 57 generates an internal enable signal enb based on the chip address CADD and the chip identification information. The internal enable signal enb generated by the logic circuit 57 is supplied to the I/O control unit 48 and the logical control unit 49. The logic circuit 57 can activate the internal enable signal enb when the chip address CADD matches the chip identification information.

FIG. 4(a) is a block diagram of an example of connection method of through electrodes for two channels in the semiconductor chip illustrated in FIG. 2 and FIG. 4(b) is a block diagram of another example of connection method of the through electrodes for the two channels in the semiconductor chip illustrated in FIG. 2. FIGS. 4(a) and 4(b) illustrate only the semiconductor chips Cp0 to Cp2 as an example.

Referring to FIGS. 4(a) and 4(b), the semiconductor chip Cp0 includes through electrodes VA0 and VB0 for two channels. The semiconductor chip Cp1 includes through electrodes VA1 and VB1 for two channels. The semiconductor chip Cp2 includes through electrodes VA2 and VB2 for two channels. The through electrode VA1 is arranged on the through electrode VA0, and the through electrode VA2 is arranged on the through electrode VA1. The through electrode VB1 is arranged on the through electrode VB0, and the through electrode VB2 is arranged on the through electrode VB1. In this example, the through electrodes VA0 to VA2 and VB0 to VB2 are connected such that the connection destinations are switched between the upper and lower layers of the semiconductor chips Cp0 to Cp2. Specifically, the through electrode VA0 is electrically connected to the through electrode VB1, and the through electrode VB1 is electrically connected to the through electrode VA2. The through electrode VB0 is electrically connected to the through electrode VA1, and the through electrode VA1 is electrically connected to the through electrode VB2.

In addition, as illustrated in FIG. 4(a), the semiconductor chips Cp0 to Cp2 include AND circuits N0 to N2, respectively. First input terminals of the AND circuits N0 to N2 are connected to the through electrodes VB0 to VB2, respectively. Internal enable signals enb0 to enb2 are input into second input terminals of the AND circuits N0 to N2, respectively. The controller chip Ce1 is disposed under the semiconductor chip Cp0. The controller chip Ce1 includes the controller 2. The controller 2 includes input buffers B0 and B1 that input signals SH0 and SH1 for two channels into the semiconductor chips Cp0 to Cp2. The controller 2 outputs the signal SH0 via the input buffer B0 and outputs the signal SH1 via the input buffer B1. The controller 2 also inputs chip addresses CADDs for specifying the semiconductor chips Cp0 to Cp2 to the semiconductor chips Cp0 to Cp2. In the semiconductor chips Cp0 to Cp2, the chip addresses CADDs input from the controller 2 are compared to the chip identification information held by the semiconductor chips Cp0 to Cp2. Then, in the semiconductor chips Cp0 to Cp2 with matches between the chip addresses CADDs and the chip identification information, the internal enable signals enb0 to enb2 are activated, and the signals SH0 and SH1 are taken into the semiconductor chips Cp0 to Cp2 via the AND circuits N0 to N2, respectively.

Accordingly, the controller 2 can assign a channel Ch0 to the semiconductor chips Cp0 and Cp2, and assign a channel Ch1 to the semiconductor chip Cp1, thereby achieving two-channel input of the NAND memory 3.

In addition, as illustrated in FIG. 4(b), the semiconductor chips Cp0 to Cp2 includes AND circuits N0' to N2', respectively. First input terminals of the AND circuits N0' to N2' are connected to the through electrode VB0 to VB2, respectively. Internal enable signals enb0' to enb2' are input into second input terminals of the AND circuits N0' to N2', respectively. The controller 2 also includes output buffers B0' and B1' to which the signals SH0 and SH1 for two channels are output from the semiconductor chips Cp0 to Cp2. The controller 2 can receive the signal SH0 via the output buffer B0' and receive the signal SH1 via the output buffer B1'.

At this time, the controller 2 also inputs the chip addresses CADDs for specifying the semiconductor chips Cp0 to Cp2 to the semiconductor chips Cp0 to Cp2. In the semiconductor chips Cp0 to Cp2, the chip addresses CADDs input from the controller 2 are compared to the chip identification information held by the semiconductor chips Cp0 to Cp2. Then, in the semiconductor chips Cp0 to Cp2 with matches between the chip addresses CADDs and the chip identification information, the internal enable signals enb0' to enb2' are activated, and the signals SH0 and SH1 are output from the semiconductor chips Cp0 to Cp2 via the AND circuits N0' to N2', respectively.

Accordingly, the controller 2 can assign the channel Ch0 to the semiconductor chips Cp0 and Cp2, and assign the channel Ch1 to the semiconductor chip Cp1, thereby achieving two-channel input of the NAND memory 3

Figure 5:
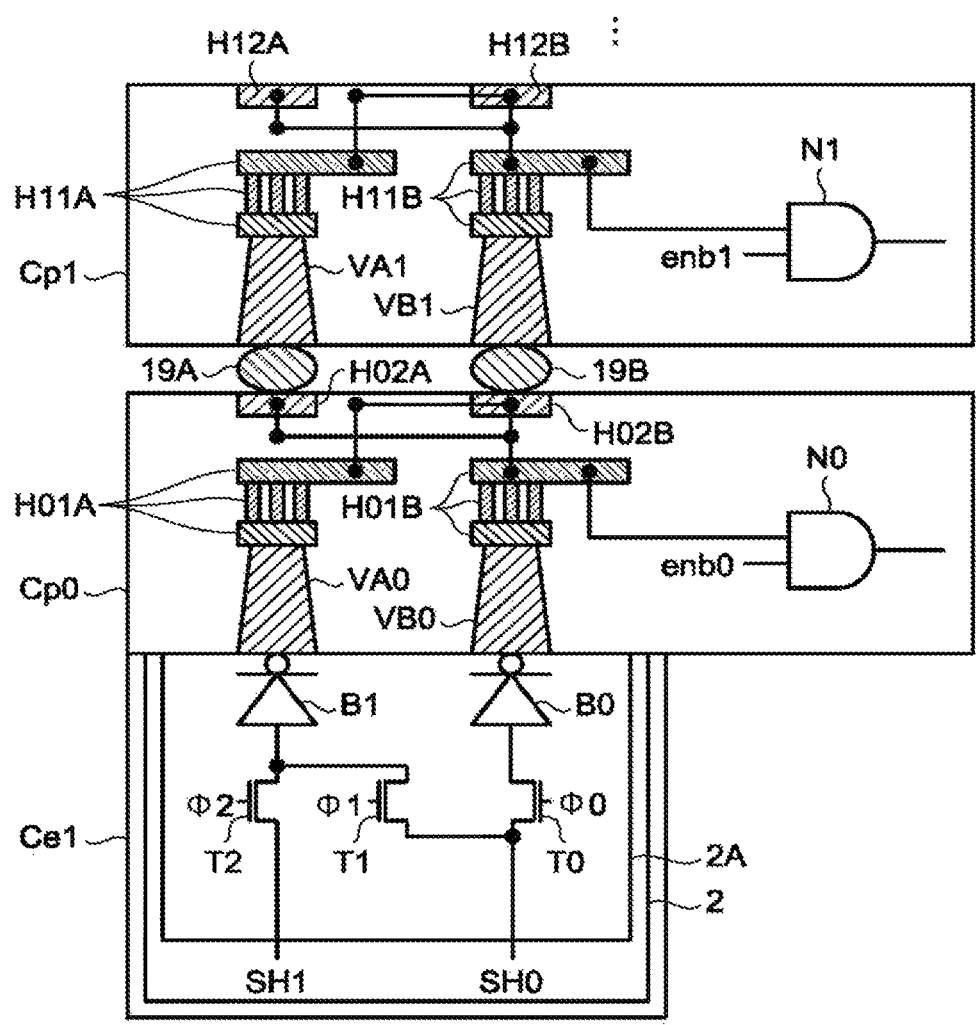
FIG. 5 is a cross-sectional view of a connection wiring example of the through electrodes for the two channels illustrated in FIG. 4.
Figure 6:
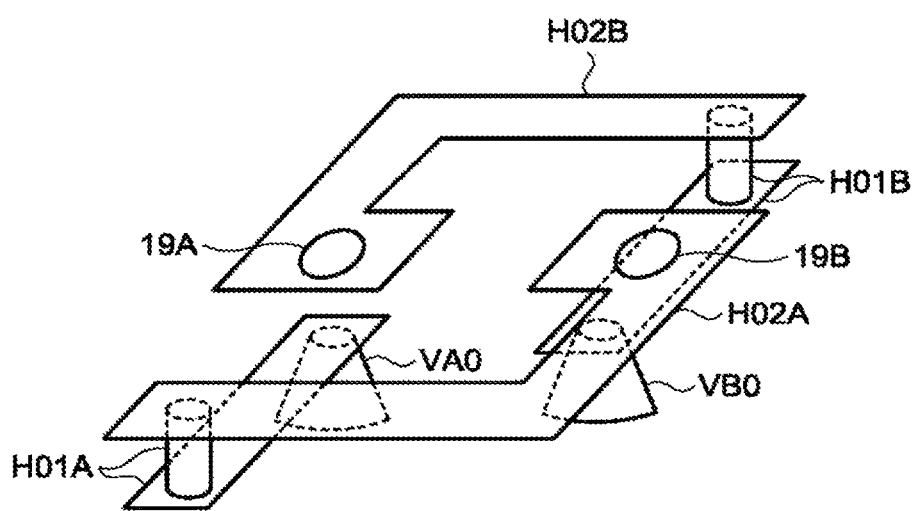
FIG. 6 is a perspective view of the connection wiring example of the through electrodes for the two channels illustrated in FIG. 5.

FIG. 5 is a cross-sectional view of a connection wiring example of the through electrodes for the two channels illustrated in FIG. 4. FIG. 6 is a perspective view of the connection wiring example of the through electrodes for the two channels illustrated in FIG. 5. FIG. 5 illustrates the example of connection wiring corresponding to the configuration illustrated in FIG. 4(a). FIG. 6 illustrates the example of connection wiring in the semiconductor chip Cp0.

Referring to FIGS. 5 and 6, the semiconductor chip Cp0 includes wires H01A, H01B, H02A, and H02B. The wires H01A and H01B can be formed on the first layer of the semiconductor chip Cp0, and the wires H02A and H02B can be formed on the second layer of the semiconductor chip Cp0. The semiconductor chip Cp1 includes the wires H11A, H11B, H12A, and H12B. The wires H11A and H11B can be formed on the first layer of the semiconductor chip Cp1, and the wires H12A and H12B can be formed on the second layer of the semiconductor chip Cp1.

The wire H01A is connected to the through electrode VA0, and the wire H01B is connected to the through electrode VB0. The wire H01A is connected to the wire H02B, and the wire H01B is connected to the wire H02A. The wire H02A can be disposed on the through electrode VA0, and the wire H02B can be disposed on the through electrode VB0.

The wire H11A is connected to the through electrode VA1, and the wire H11B is connected to the through electrode VB1. The wire H11A is connected to the wire H12B, and the wire H11B is connected to the wire H12A. The wire H12A can be disposed on the through electrode VA1, and the wire H12B can be disposed on the through electrode VB1.

The wire H02A is connected to the through electrode VA1 via the solder ball 19A, and the wire H02B is connected to the through electrode VB1 via the solder ball 19B.

Using the two-layer wires, the through electrode VA0 can be connected to the through electrode VB1 and the through electrode VB0 can be connected to the through electrode VA1 without changing the positions of the through electrodes VA0, VB0, VA1, and VB1.

The controller 2 also includes the channel control unit 2A. The channel control unit 2A includes MOS transistors T0 to T2. The drain of the MOS transistor T0 is connected to the input buffer B0, the drains of the MOS transistors T1 and T2 are connected to the input buffer B1. The signal SH0 is input into the sources of the MOS transistors T0 and T1, and the signal SH1 is input into the source of the MOS transistor T2. Control signals Φ0 to Φ2 are input into the gates of the MOS transistors T0 to T2.

In order to operate the NAND memory 3 with two channels, the controller 2 can set the control signals Φ0 and Φ2 to high and the control signal Φ1 to low. Accordingly, the controller 2 can supply the signal SH0 to the semiconductor chip Cp0 and supply the signal SH1 to the semiconductor chip Cp1, thereby operating the NAND memory 3 with two channels.

Meanwhile, in order to operate the NAND memory 3 with one channel, the controller 2 can set the control signals Φ0 and Φ1 to high and the control signal Φ2 to low. Accordingly, the controller 2 can supply the signal SH0 to the semiconductor chips Cp0 and Cp1, thereby operating the NAND memory 3 with one channel.

Second Embodiment

Figure 7:
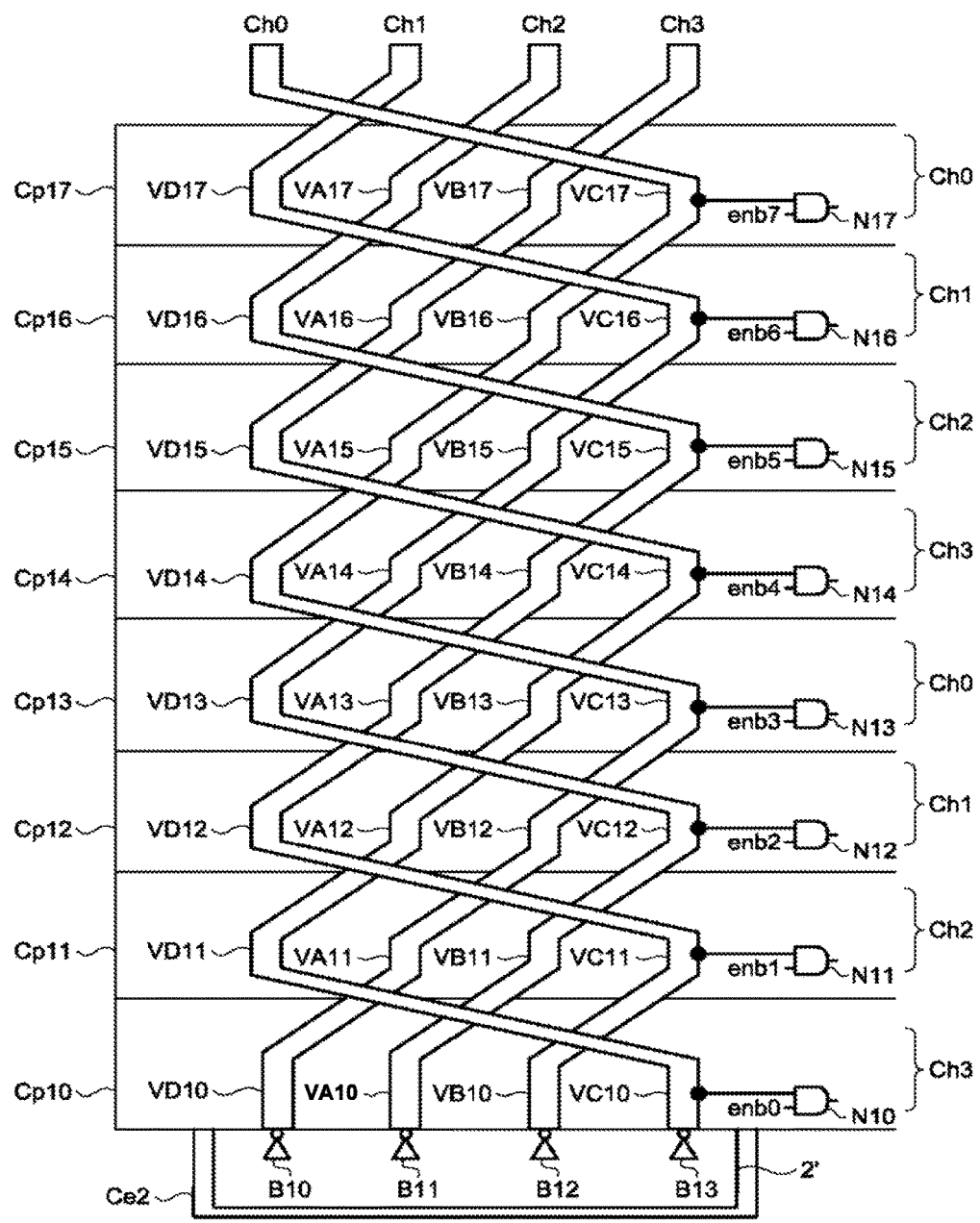
FIG. 7 is a block diagram illustrating a connection method of through electrodes for four channels applied to a semiconductor device according to a second embodiment.

FIG. 7 is a block diagram illustrating a connection method of through electrodes for four channels applied to a semiconductor device according to a second embodiment. FIG. 7 illustrates semiconductor chips Cp10 to Cp17 for eight layers as an example. In addition, FIG. 7 illustrates the configuration in which the signals input into the semiconductor chips Cp10 to Cp17 are turned into four channels as an example. However, the example of FIG. 7 is also applicable to the configuration in which the signals output from the semiconductor chips Cp10 to Cp17 are turned into four channels.

Referring to FIG. 7, the semiconductor chip Cp10 includes through electrodes VA10 to VD10 for four channels. The semiconductor chip Cp11 includes through electrodes VA11 to VD11 for four channels. The semiconductor chip Cp12 includes through electrodes VA12 to VD12 for four channels. The semiconductor chip Cp13 includes through electrodes VA13 to VD13 for four channels. The semiconductor chip Cp14 includes through electrodes VA14 to VD14 for four channels. The semiconductor chip Cp15 includes through electrode VA15 to VD15 for four channels. The semiconductor chip Cp16 includes through electrodes VA16 to VD16 for four channels. The semiconductor chip Cp17 includes through electrodes VA17 to VD17 for four channels.

The through electrodes VA10 to VA17 are stacked in sequence, the through electrodes VB10 to VB17 are stacked in sequence, the through electrodes VC10 to VC17 are stacked in sequence, and the through electrodes VD10 to VD17 are stacked in sequence. In this example, the through electrodes VA10 to VA17, VB10 to VB17, VC10 to VC17, and VD10 to VD17 are connected such that the connection destinations are switched in sequence between the upper and lower layers of the semiconductor chips Cp10 to Cp17. For example, between the semiconductor chips Cp10 and Cp11 the through electrode VD10 is electrically connected to the through electrode VA11, the through electrode VA10 is electrically connected to the through electrode VB11, the through electrode VB10 is electrically connected to the through electrode VC11, and the through electrode VC10 is electrically connected to the through electrode VD11.

In addition, the semiconductor chips Cp10 to Cp17 include AND circuits N10 to N17, respectively. First input terminals of the AND circuits N10 to N17 are connected to the through electrodes VC10 to VC17, respectively. Internal enable signals enb0 to enb7 are input into second input terminals of the AND circuits N10 to N17, respectively. A controller chip Ce2 is disposed under the semiconductor chip Cp10. The controller chip Ce2 includes a controller 2'. The controller 2' includes input buffers B10 to B13 that input signals SH0 to SH3 for four channels to the semiconductor chips Cp10 to Cp17. The controller 2' outputs the signal SH0 via the input buffer B10, outputs the signal SH1 via the input buffer B11, outputs the signal SH2 via the input buffer B12, and outputs the signal SH3 via the input buffer B13. The controller 2' also inputs chip addresses CADDs for specifying the semiconductor chips Cp10 to Cp17 to the semiconductor chips Cp10 to Cp17. In the semiconductor chips Cp10 to Cp17, the chip addresses CADDs input from the controller 2 are compared to the chip identification information held by the semiconductor chips Cp10 to Cp17. Then, in the semiconductor chips Cp10 to Cp17 with matches between the chip addresses CADDs and the chip identification information, the internal enable signals enb0 to enb7 are activated, and the signals SH0 to SH3 are taken into the semiconductor chips Cp10 to Cp17 via the AND circuits N10 to N17, respectively.

Accordingly, the controller 2' can assign the channel Ch0 to the semiconductor chips Cp13 and Cp17, assign the channel Ch1 to the semiconductor chips Cp12 and Cp16, assign the channel Ch2 to the semiconductor chips Cp11 and Cp15, and assign the channel Ch3 to the semiconductor chips Cp10 and Cp14, thereby achieving four-channel input of the NAND memory 3.

Figure 8:
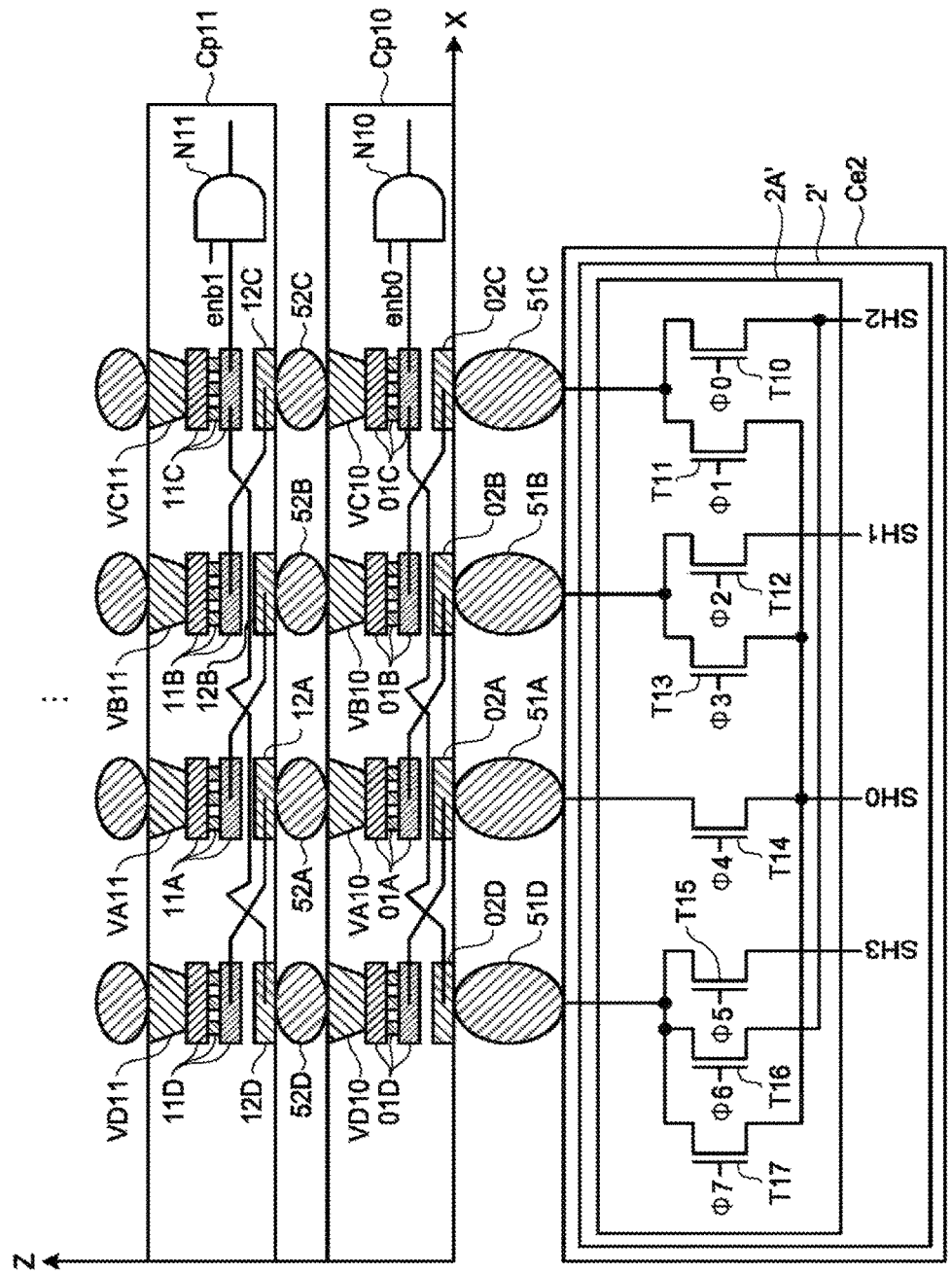
FIG. 8 is a cross-sectional view of a connection wiring example of the through electrodes for the four channels illustrated in FIG. 7.

FIG. 8 is a cross-sectional view of a connection wiring example of the through electrodes for the four channels illustrated in FIG. 7. FIG. 8 illustrates the connection wiring example in the semiconductor chips Cp10 and Cp11. FIG. 8 does not illustrate the input buffers B10 to B13 illustrated in FIG. 7.

Referring to FIG. 8, the semiconductor chip Cp10 includes wires 01A to 01D and 02A to 02D. The wires 01A to 01D can be formed on the first layer of the semiconductor chip Cp10, and the wires 02A to 02D can be formed on the second layer of the semiconductor chip Cp10. The semiconductor chip Cp11 includes wire 11A to 11D and 12A to 12D. The wires 11A to 11D can be formed on the first layer of the semiconductor chip Cp11, and the wires 12A to 12D can be formed on the second layer of the semiconductor chip Cp11.

The wire 01A is connected to the through electrode VA10, the wire 01B is connected to the through electrode VB10, the wire 01C is connected to the through electrode VC10, and the wire 01D is connected to the through electrode VD10. The wire 01A is connected to the wire 02B, the wire 01B is connected to the wire 02C, the wire 01C is connected to the wire 02D, and the wire 01D is connected to the wire 02A. The wire 02A can be disposed on the through electrode VA10, the wire 02B can be disposed on the through electrode VB10, the wire 02C can be disposed on the through electrode VC10, and the wire 02D can be disposed on the through electrode VD10.

The wire 11A is connected to the through electrode VA11, the wire 11B is connected to the through electrode VB11, the wire 11C is connected to the through electrode VC11, and the wire 11D is connected to the through electrode VD11. The wire 11A is connected to the wire 12B, the wire 11B is connected to the wire 12C, the wire 11C is connected to the wire 12D, and the wire 11D is connected to the wire 12A. The wire 12A can be disposed on the through electrode VA11, the wire 12B can be disposed on the through electrode VB11, the wire 12C can be disposed on the through electrode VC11, and the wire 12D can be disposed on the through electrode VB11.

The wire 12A is connected to the through electrode VA10 via a solder ball 52A, the wire 12B is connected to the through electrode VB10 via a solder ball 52B, the wire 12C is connected to the through electrode VC10 via a solder ball 52C, and the wire 12D is connected to the through electrode VD10 via a solder ball 52D. The wires 01A to 01D are connected to the controller chip Ce2 via solder balls 51A to 51D, respectively.

By using the two-layer wires, the through electrode VA10 can be connected to the through electrode VD11, the through electrode VB10 can be connected to the through electrode VA11, the through electrode VC10 can be connected to the through electrode VB11, and the through electrode VD10 can be connected to the through electrode VC11 without changing the positions of the through electrodes VA10 to VD10 and VA11 to VD11.

The controller 2' also includes a channel control unit 2A'. The channel control unit 2A' includes MOS transistors T11 to T17. The drains of the MOS transistors T10 and T11 are connected to the solder ball 51C, the drains of the MOS transistors T12 and T13 are connected to the solder ball 51B, the drain of the MOS transistor T14 is connected to the solder ball 51A, and the drains of the MOS transistors T15 and T16 are connected to the solder ball 51D. The signal SH0 can be input into the sources of the MOS transistors T11, T13, T14, and T17, the signal SH1 can be input into the source of the MOS transistor T12, the signal SH2 can be input into the sources of the MOS transistors T10 and T16, and the signal SH3 can be input into the source of the MOS transistor T15. The control signals $\Phi 0$ to $\Phi 7$ are input into the gates of the MOS transistors T10 to T17, respectively.

In order to operate the NAND memory 3 with four channels, the controller 2' can set the control signals $\Phi 0$, $\Phi 2$, $\Phi 4$, and $\Phi 5$ to high, and set the control signals $\Phi 1$, $\Phi 3$, $\Phi 6$, and $\Phi 7$ to low, for example. Accordingly, the controller 2' can supply the signal SH0 to the semiconductor chips Cp13 and Cp17, supply the signal SH1 to the semiconductor chips Cp12 and Cp16, supply the signal SH2 to the semiconductor chips Cp11 and Cp15, and supply the signal SH3 to the semiconductor chips Cp10 and Cp14, thereby operating the NAND memory 3 with four channels.

In order to operate the NAND memory 3 with three channels, the controller 2' can set the control signals $\Phi 0$, $\Phi 2$, $\Phi 4$, and $\Phi 7$ to high, and set the control signals $\Phi 1$, $\Phi 3$, $\Phi 5$, and $\Phi 6$ to low, for example. Accordingly, the controller 2' can supply the signal SH0 to the semiconductor chips Cp13 and Cp17, supply the signal SH1 to the semiconductor chips Cp12 and Cp16, supply the signal SH2 to the semiconductor chips Cp11 and Cp15, and supply the signal SH0 to the semiconductor chips Cp10 and Cp14, thereby operating the NAND memory 3 with three channels.

In order to operate the NAND memory 3 with two channels, the controller 2' can set the control signals $\Phi 0$, $\Phi 3$, $\Phi 4$, and $\Phi 6$ to high, and set the control signals $\Phi 1$, $\Phi 2$, $\Phi 5$, and $\Phi 7$ to low, for example. Accordingly, the controller 2' can supply the signal SH0 to the semiconductor chips Cp12, Cp13, Cp16, and Cp17, and supply the signal SH2 to the semiconductor chips Cp10, Cp11, Cp14, and Cp15, thereby operating the NAND memory 3 with two channels.

In order to operate the NAND memory 3 with one channel, the controller 2' can set the control signals $\Phi 1$, $\Phi 3$, $\Phi 4$, and $\Phi 7$ to high, and set the control signals $\Phi 0$, $\Phi 2$, $\Phi 5$, and $\Phi 6$ to low, for example. Accordingly, the controller 2' can supply the signal SH0 to the semiconductor chips Cp10 to Cp17, thereby operating the NAND memory 3 with one channel.

FIG. 9 is a diagram illustrating an assignment example of chip enable signals to the signals for the four channels illustrated in FIG. 8.

Referring to FIG. 9, the controller 2' can control the number of chip enable signals to be assigned to the signals for N channels. For example, in the case of one-channel operation, the controller 2' can assign the common chip enable signal CE0 to the signals SH0 to SH3 for the four channels. This makes it possible to reduce the number of times when the chip enable signal is switched with chip switching and simplify the control operation. Alternatively, in the case of one-channel operation, the controller 2' may assign the separate chip enable signals CE0 to CE3 to the signals SH0 to SH3 for the four channels. This makes it possible to deactivate the unselected chips and reduce power consumption.

Figure 10:
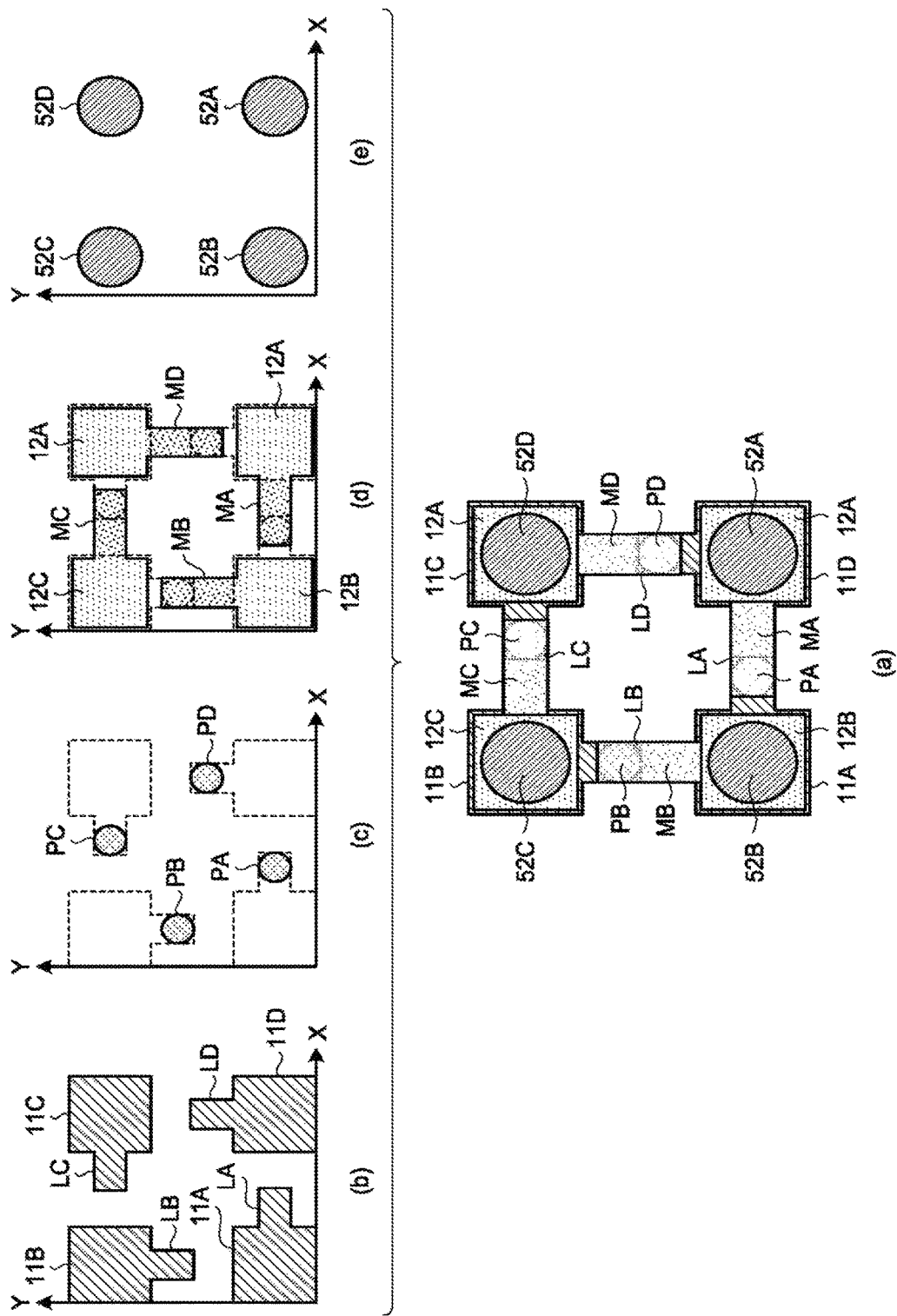
FIG. 10(a) is a plane view of the connection wiring example of the through electrodes for the four channels illustrated in FIG. 8 and FIGS. 10(b) to 10(e) are plane views of individual wiring layers in the connection wiring illustrated in FIG. 10(a).

FIG. 10(a) is a plane view of the connection wiring example of the through electrodes for the four channels illustrated in FIG. 8 and FIGS. 10(b) to 10(e) are plane views of individual wiring layers in the connection wiring illustrated in FIG. 10(a). FIGS. 10(a) to 10(e) illustrate a connection wiring example of the semiconductor chip Cp11 illustrated in FIG. 8.

Referring to FIG. 10(a), the through electrode VA10 to VD10 and VA11 to VD11 are disposed in square form. The wires 11A to 11D are disposed on the through electrodes VA11 to VD11, respectively. Lead portions LA to LD are added to the wires 11A to 11D in the directions of the wires 11D and 11A to 11C, respectively. The wires 12A to 12D are disposed on the wires 11D and 11A to 11C, respectively. Lead portions MA to MD are added to the wires 12A to 12D in the directions of the wires 12B to 12D and 12A, respectively. Solder balls 52A to 52D are disposed on the wires 12A to 12D, respectively. The lead portions LA to LD are connected to the lead portions MA to MD via plug electrodes PA to PD, respectively.

Accordingly, it is possible to connect the through electrode VA10 to the through electrode VD11, connect the through electrode VB10 to the through electrode VA11, connect the through electrode VC10 to the through electrode VB11, and connect the through electrode VD10 to the through electrode VC11 while suppressing increase in the layout area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
    M (M represents an integer of 2 or larger) semiconductor chips that are stacked; and
    a controller chip that controls the semiconductor chips, wherein
    the M semiconductor chips include a first semiconductor chip and a second semiconductor chip,
    the first semiconductor chip is stacked on the controller chip and includes
        a $1^{st}$ through electrode,
        a $2^{nd}$ through electrode,
        a $3^{rd}$ through electrode, and
        a $4^{th}$ through electrode,
    the second semiconductor chip is stacked on the first semiconductor chip and includes
        a $5^{th}$ through electrode,
        a $6^{th}$ through electrode,
        a $7^{th}$ through electrode, and
        an $8^{th}$ through electrode,
    the $5^{th}$ through electrode is disposed on a location not corresponding to the $4^{th}$ through electrode and is electrically connected to the $4^{th}$ through electrode,
    the $6^{th}$ through electrode is disposed on a location not corresponding to the $1^{st}$ through electrode and is electrically connected to the $1^{st}$ through electrode, and
    the $5^{th}$ through electrode is disposed on a location corresponding to the $1^{st}$ through electrode,
    the $6^{th}$ through electrode is disposed on a location corresponding to the $2^{nd}$ through electrode and is electrically connected to the $1^{st}$ through electrode,
    the $7^{th}$ through electrode is disposed on a location corresponding to the $3^{rd}$ through electrode and is electrically connected to the $2^{nd}$ through electrode,
    the $8^{th}$ through electrode is disposed on a location corresponding to the $4^{th}$ through electrode and is electrically connected to the $3^{rd}$ through electrode,
    the controller chip controls a number of channels achieved by the $1^{st}$ to $8^{th}$ through electrodes by inputting a same signal into two or more through electrodes among the $1^{st}$ to $4^{th}$ through electrodes or by inputting different signals into the $1^{st}$ to $4^{th}$ through electrodes,
    the controller chip includes
        a $1^{st}$ transistor whose source is electrically coupled to a $1^{st}$ input node and whose drain is electrically coupled to the $1^{st}$ through electrode,
        a $2^{nd}$ transistor whose source is electrically coupled to a $2^{nd}$ input node and whose drain is electrically coupled to the $2^{nd}$ through electrode,
        a $3^{rd}$ transistor whose source is electrically coupled to a $3^{rd}$ input node and whose drain is electrically coupled to the $3^{rd}$ through electrode,
        a $4^{th}$ transistor whose source is electrically coupled to a $4^{th}$ input node and whose drain is electrically coupled to the $4^{th}$ through electrode,
        a $5^{th}$ transistor whose source is electrically coupled to the $4^{th}$ input node and whose drain is electrically coupled to the Pt through electrode,
        a $6^{th}$ transistor whose source is electrically coupled to the $2^{nd}$ input node and whose drain is electrically coupled to the $4^{th}$ through electrode, and
        a $7^{th}$ transistor whose source is electrically coupled to the $2^{nd}$ input node and whose drain is electrically coupled to the $1^{st}$ through electrode.

2. The semiconductor device according to claim 1, wherein, in order to operate the first and second semiconductor chips with K (K represents an integer of equal to or smaller than M) channels, the controller chip divides the $1^{st}$ to $8^{th}$ through electrodes into K groups, inputs the same signal into a same group, and inputs the different signals into different groups.

3. The semiconductor device according to claim 1, wherein the controller chip controls a number of pieces of signals to be input from the $1^{st}$ to $4^{th}$ input nodes to the $1^{st}$ to $4^{th}$ through electrodes by controlling on-off states of the $1^{st}$ to $7^{th}$ transistors.

4. The semiconductor device according to claim 1, wherein the semiconductor chips are NAND memories.

5. The semiconductor device according to claim 1, wherein the first semiconductor chip further includes:
  a first internal circuit and
  a first interface that electrically connects the $4^{th}$ through electrode to the first internal circuit, and
the second semiconductor chip further includes:
  a second internal circuit and
  a second interface that electrically connects the $4^{th}$ through electrode to the second internal circuit.

6. The semiconductor device according to claim 5, wherein,
  the channels include a first channel, a second channel, a third channel, and a fourth channel,
  the $1^{st}$ through electrode and the $6^{th}$ through electrode correspond to the first channel,
  second $4^{th}$ through electrode and the $5^{th}$ through electrode correspond to the second channel,
  the $2^{nd}$ through electrode and the $7^{th}$ through electrode correspond to the third channel,
  the $3^{rd}$ through electrode and the $8^{th}$ through electrode correspond to the fourth channel,
  in the first semiconductor chip, the first interface forms the second channel for the first semiconductor chip, and
  in the second semiconductor chip, the second interface forms the fourth channel for the second semiconductor chip.

7. The semiconductor device according to claim 6, wherein
  the first interface includes a first AND circuit that takes in a first signal for the second channel according to a first internal enable signal,
  the second interface includes a second AND circuit that takes in a second signal for the fourth channel according to a second internal enable signal.

8. The semiconductor device according to claim 7, wherein
  the first semiconductor chip further includes a first logic circuit that generates the first internal enable signal based on a chip address and first chip identification information, and
  the second semiconductor chip further includes a second logic circuit that generates the second internal enable signal based on another chip address and second chip identification information.

9. The semiconductor device according to claim 1, wherein
  the $1^{st}$ first through electrode, the $4^{th}$ through electrode, the $2^{nd}$ through electrode, and the $3^{rd}$ through electrode are disposed in square form, and
  the $5^{th}$ through electrode, the $6^{th}$ through electrode, the $7^{th}$ through electrode, and the $8^{th}$ through electrode are disposed in square form.

10. The semiconductor device according to claim 3, wherein
  the signals to be input to the $1^{st}$ to $4^{th}$ through electrodes include at least one of an address latch enable signal, a command latch enable signal, a read enable signal, a write enable signal, a data signal, a data strobe signal, a chip enable signal, a write protect signal, a ready/busy signals, and a chip address signal.

11. The semiconductor device according to claim 10, wherein
  the controller chip assigns a common signal as the signals to be input to the $1^{st}$ to $4^{th}$ through electrodes.

12. The semiconductor device according to claim 10, wherein
  the controller chip assigns a first common signal to be input to the $1^{st}$ and $4^{th}$ through electrodes and assigns a second common signal to be input to the $2^{nd}$ and $3^{rd}$ through electrodes.

13. The semiconductor device according to claim 10, wherein
  the controller chip assigns a first common signal to be input to the $1^{st}$, $2^{nd}$ and $4^{th}$ through electrodes and assigns a second signal to be input to the $3^{rd}$ through electrode.

14. The semiconductor device according to claim 10, wherein
  the controller chip assigns the different signals as the signals to be input to the $1^{st}$ to $4^{th}$ through electrodes.

15. The semiconductor device according to claim 10, wherein
  the first semiconductor chip further includes
    a first logic circuit that generates a first internal enable signal based on a chip address and first chip identification information, and
  the second semiconductor chip further includes
    a second logic circuit that generates a second internal enable signal based on another chip address and second chip identification information.

16. The semiconductor device according to claim 15, wherein
  the first semiconductor chip further includes
    a first I/O controller that receives the generated first internal enable signal and
    a first logic controller that receives the generated first internal enable signal,
  the second semiconductor chip further includes
    a second I/O controller that receives the generated second internal enable signal and
    a second logic controller that receives the generated second internal enable signal.

17. The semiconductor device according to claim 15, wherein
  the first logic circuit activates the first internal enable signal when the chip address matches the first chip identification information, and
  the second logic circuit activates the second internal enable signal when the other chip address matches the second chip identification information.

* * * * *